United States Patent
Shimura

(10) Patent No.: US 10,211,812 B2
(45) Date of Patent: Feb. 19, 2019

(54) PHASE-SWITCH-EQUIPPED VARIABLE AMPLIFICATION DEVICE AND PHASE SHIFTER

(71) Applicant: FUJITSU LIMITED, Kawasaki-shi, Kanagawa (JP)

(72) Inventor: Toshihiro Shimura, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/789,624

(22) Filed: Oct. 20, 2017

(65) Prior Publication Data
US 2018/0131350 A1  May 10, 2018

(30) Foreign Application Priority Data
Nov. 7, 2016 (JP) ................................. 2016-217462

(51) Int. Cl.
| H03K 3/00 | (2006.01) |
| H03H 11/16 | (2006.01) |
| H03F 3/45 | (2006.01) |
| H03G 3/30 | (2006.01) |
| H03G 1/00 | (2006.01) |

(52) U.S. Cl.
CPC ......... *H03H 11/16* (2013.01); *H03F 3/45475* (2013.01); *H03G 1/0088* (2013.01); *H03G 3/30* (2013.01); *H03F 2200/06* (2013.01); *H03F 2200/09* (2013.01); *H03F 2203/45171* (2013.01); *H03F 2203/45621* (2013.01); *H03F 2203/45731* (2013.01); *H03G 2201/106* (2013.01)

(58) Field of Classification Search
CPC ......... H01L 2924/00; H01L 2924/0002; H03F 2200/534; H03F 2200/537; H03F 2200/541
See application file for complete search history.

(56) References Cited

U.S. PATENT DOCUMENTS

| 9,219,518 B1 * | 12/2015 | Chen ........................ H04B 1/48 |
| 2014/0152347 A1 | 6/2014 | Sato |
| 2015/0137892 A1 | 5/2015 | Imazeki et al. |

FOREIGN PATENT DOCUMENTS

| JP | 58-047336 A | 3/1983 |
| JP | 2014-110492 A | 6/2014 |
| JP | 2014-199966 A | 10/2014 |

* cited by examiner

*Primary Examiner* — Sibin Chen
(74) *Attorney, Agent, or Firm* — Arent Fox LLP

(57) ABSTRACT

There is provided a phase-switch-equipped variable amplification device including a switch including one input port and two output ports and configured to output a single-ended signal input to the one input port into one of the two output ports, a first converter coupled to the two output ports of the switch and configured to convert the single-ended signal output from the switch into a pair of differential signals having phases different from each other by 180-degree and invert phases of the pair of differential signals in response to a switching operation at the switch, a variable amplifier configured to amplify the pair of differential signals in accordance with a control voltage, and a second converter configured to convert the pair of differential signals amplified by the variable amplifier into a single-ended signal.

20 Claims, 14 Drawing Sheets

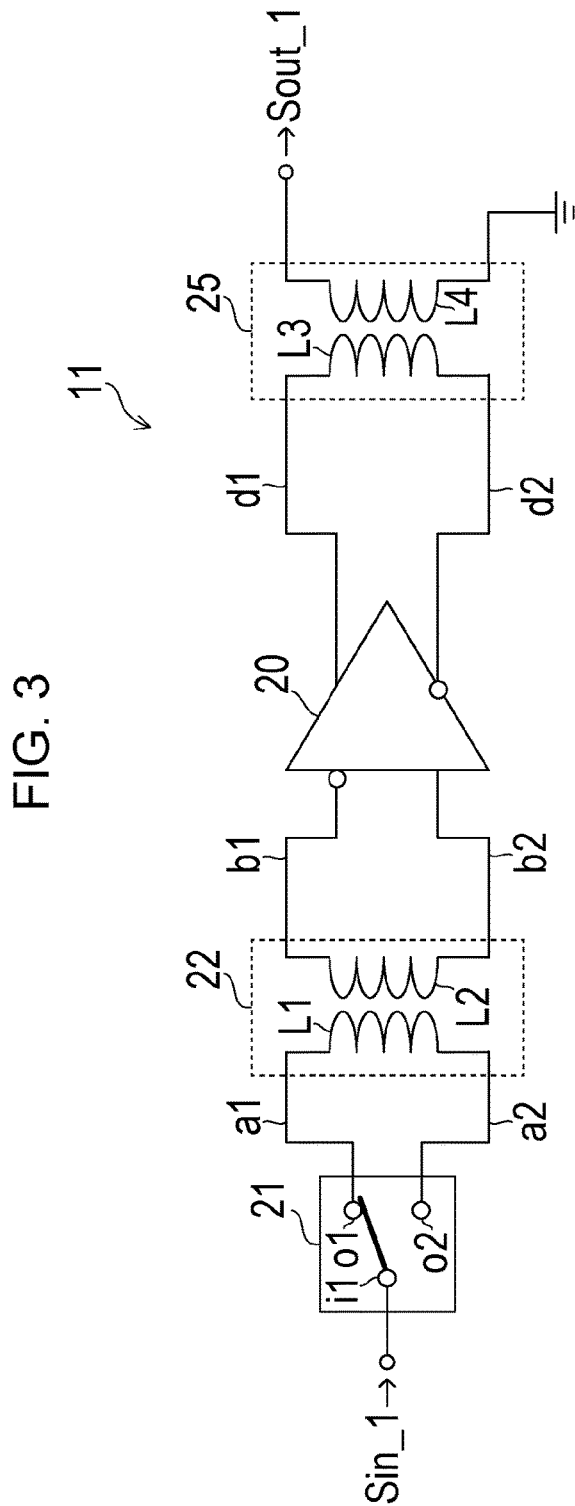

PHASE-SWITCH-EQUIPPED VARIABLE AMPLIFICATION DEVICE AND PHASE SHIFTER

CROSS-REFERENCE TO RELATED APPLICATION

This application is based upon and claims the benefit of priority of the prior Japanese Patent Application No. 2016-217462, filed on Nov. 7, 2016, the entire contents of which are incorporated herein by reference.

FIELD

The embodiments discussed herein are related to a phase-switch-equipped variable amplification device and a phase shifter.

BACKGROUND

Recently, a phased array system for steering the direction of an antenna beam at a high frequency, in particular, in a milli-wave band has been used, for example, in the fields of communication and sensor. The phased array system includes, for example, a phase shifter. The phase shifter is desirably capable of shifting the phase of a signal in a range of 0° to 360° while maintaining the amplitude thereof.

Technologies described below are known as technologies related to such a phase shifter. For example, a variable phase device including a transmission line, a vector synthesizer, and a phase controller is known. The transmission line outputs signals having phases orthogonal to each other through a pair of output ports. The vector synthesizer includes first and second transistors connected with a pair of respective output ports so that a parasitic capacitor acts as a load impedance for the transmission line. The vector synthesizer amplifies, through the first and second transistors, signals output in phases in accordance with the load impedance from the pair of output ports of the transmission line, and synthesizes the amplified signals. The phase controller controls the phase of the output signal synthesized and output by the synthesizer by controlling amplification operations at the first and second transistors of the synthesizer.

Technologies described below are known as technologies related to an amplification circuit applicable to a phase shifter. For example, a polarity switching amplification circuit including first and second amplification transistors, a transformer, and a polarity switching controller is known. Unbalanced input signals (single-ended signals) are input to the first and second amplification transistors. The transformer includes a primary winding wire and a secondary winding wire. Output signals from the first and second amplification transistors are input as balanced signals (differential signals) to the primary winding wire and output from the secondary winding wire. The polarity switching controller turns on one of the first and second amplification transistors while turning off the other amplification transistor.

A known endless phase shifter that is capable of endlessly shifting the phase angle of 360-degree includes a unit for bifurcating an input signal into two signals having a phase relation of 90°, first and second modulation units having configurations identical to each other, and a unit for synthesizing output signals from the first and second modulation units. The first and second modulation units each include a unit for inverting a phase by 0° or 180°, and a unit for controlling a signal level independently from the phase inverting unit. The first and second modulation units each modulate each of the two bifurcated signals to a signal at a predetermined level having a phase relation of 0° or 180° relative to the bifurcated signal.

The related techniques are disclosed in, for example, Japanese Laid-open Patent Publication Nos. 2014-110492, 2014-199966, and 58-47336.

SUMMARY

According to an aspect of the invention, a phase-switch-equipped variable amplification device includes a switch including one input port and two output ports and configured to output a single-ended signal input to the one input port into one of the two output ports, a first converter coupled to the two output ports of the switch and configured to convert the single-ended signal output from the switch into a pair of differential signals having phases different from each other by 180-degree and invert phases of the pair of differential signals in response to a switching operation at the switch, a variable amplifier configured to amplify the pair of differential signals in accordance with a control voltage, and a second converter configured to convert the pair of differential signals amplified by the variable amplifier into a single-ended signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3 is a circuit block diagram illustrating the configuration of a phase-switch-equipped variable amplification device according to the embodiment of the disclosed technology;

DESCRIPTION OF EMBODIMENTS

Figure 1:
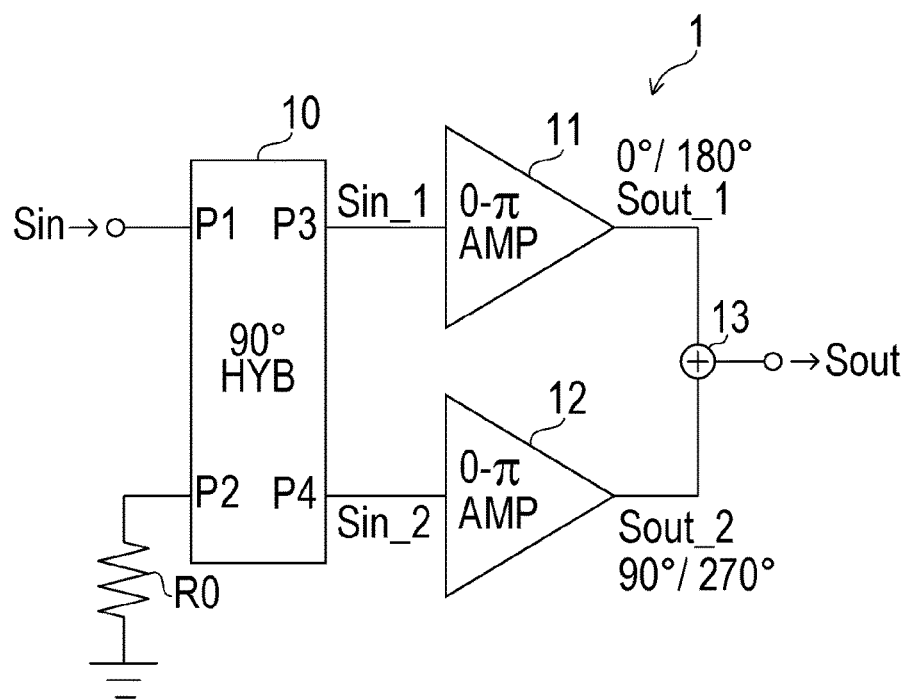
FIG. 1 is a diagram illustrating the configuration of a phase shifter according to an embodiment of the disclosed technology.
Figure 2A:
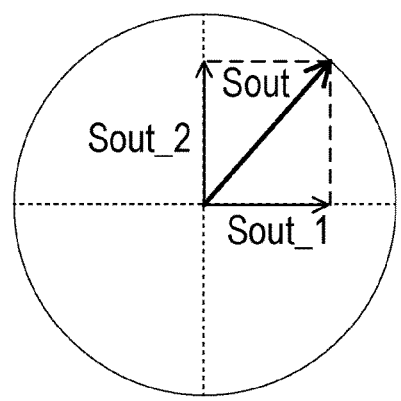
FIG. 2A is a vector diagram illustrating the phase of an output signal from the phase shifter according to the embodiment of the disclosed technology.
Figure 2C:
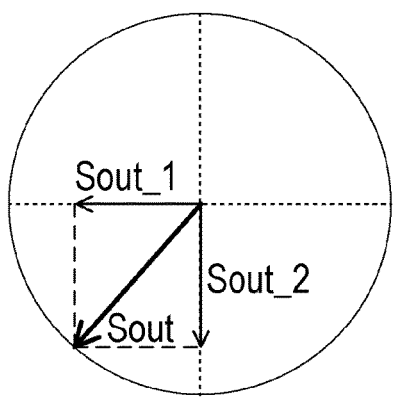
FIG. 2C is a vector diagram illustrating the phase of an output signal from the phase shifter according to the embodiment of the disclosed technology.
Figure 2B:
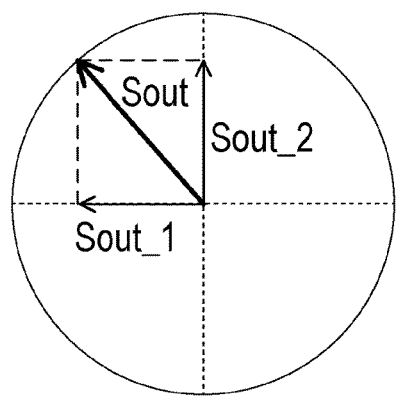
FIG. 2B is a vector diagram illustrating the phase of an output signal from the phase shifter according to the embodiment of the disclosed technology.
Figure 2D:
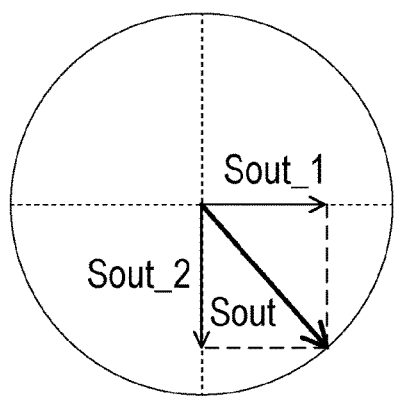
FIG. 2D is a vector diagram illustrating the phase of an output signal from the phase shifter according to the embodiment of the disclosed technology.

In a polarity switching amplification circuit, a polarity switching controller turns on one of first and second amplification transistors connected with ends of a primary winding wire of a transformer while turning off the other amplification transistor. The polarity of an output signal is switched by switching an amplification transistor being turned on. In other words, one of the ends of the primary winding wire of the transformer is connected with a transistor being turned off, at which a loss occurs. Output electrical power corresponding to the loss may be compensated by adding an amplifier at a later stage or increasing drive electrical power of the first and second amplification transistors, which results in increase of electric power consumption.

The following describes, with reference to the accompanying drawings, an exemplary embodiment of a technology related to a phase-switch-equipped variable amplification device in which such a loss is small. In the drawings, any identical or equivalent component or part is denoted by an identical reference sign.

First Embodiment

FIG. 1 is a diagram illustrating the configuration of a phase shifter 1 according to a first embodiment of the disclosed technology. The phase shifter 1 is a circuit configured to shift the phase of an input signal Sin in accordance with an externally supplied control voltage and output the resulting signal as an output signal Sout. The phase shifter 1 is a vector synthesizing phase shifter capable of continuously shifting the phase of the output signal Sout in a range of 0° to 360° while maintaining the amplitude of the output signal Sout. The phase shifter 1 includes a 90° hybrid circuit 10, two phase-switch-equipped variable amplification devices (hereinafter referred to as 0-π AMPs) 11 and 12, and a synthesizer 13.

The 90° hybrid circuit 10 divides the input signal Sin into two signals having identical amplitudes and phases different from each other by 90°. The 90° hybrid circuit 10 includes first to fourth ports P1 to P4. The first port P1 receives the input signal Sin. The second port P2 is connected with a ground line through a resistor R0. A first signal Sin_1 having a phase different from that of the input signal Sin by, for example, 90° is output through the third port P3. A second signal Sin_2 having a phase different from that of the input signal Sin by, for example, 180° is output through the fourth port P4. The first signal Sin_1 and the second signal Sin_2 may be any signals having different phases from each other by 90°, and the phase difference from the input signal Sin is not limited to the difference described above. The first signal Sin_1 is input to the 0-π AMPs 11 and the second signal Sin_2 is input to the 0-π AMP 12.

The 0-π AMP 11 amplifies the amplitude of the input first signal Sin_1 in accordance with an externally supplied control voltage, and outputs the resulting signal as an output signal Sout_1. The 0-π AMP 11 is capable of switching the phase of the output signal Sout_1 so that the output signal Sout_1 has a phase different from that of the first signal Sin_1 by 0° or 180°.

The 0-π AMP 12 has a function and a configuration same as those of the 0-π AMP 11. Specifically, the 0-π AMP 12 attenuates the amplitude of the input second signal Sin_2 in accordance with an externally supplied control voltage, and outputs the resulting signal as an output signal Sout_2. The 0-π AMP 12 is capable of switching the phase of the output signal Sout_2 so that the output signal Sout_2 has a phase different from the second signal Sin_2 by 0° or 180° (in other words, the output signal Sout_2 has a phase different from that of the first signal Sin_1 by 90° or 270°).

The synthesizer 13 performs in-phase synthesis of the output signal Sout_1 from the 0-π AMP 11 and the output signal Sout_2 from the 0-π AMPs 12, and outputs the resulting signal as the output signal Sout.

FIGS. 2A, 2B, 2C, and 2D are each a vector diagram illustrating the phase of the output signal Sout generated through vector synthesis of the output signal Sout_1 from the 0-π AMP 11 and the output signal Sout_2 from the 0-π AMP 12. The 0-π AMPs 11 and 12 have functions of switching the phases of the respective output signals Sout_1 and Sout_2 by 180° and changing the amplitudes thereof so that the phase of the output signal Sout is shifted in a range of 0° to 360° while the amplitude thereof is being maintained.

FIG. 3 is a circuit block diagram illustrating the configuration of the 0-π AMP 11. The 0-π AMP 12 has a configuration same as that of the 0-π AMP 11. The 0-π AMP 11 includes a switch 21, a transformer 22, a variable amplifier 20, and a transformer 25.

The switch 21 functions as a single-pole/double-throw (SPDT) switch including a one input end i1 and two output ends o1 and o2. The first signal Sin_1 output from the 90° hybrid circuit 10 is input to an input end i1 of the switch 21 included in the 0-π AMP 11. The switch 21 outputs the first signal Sin_1 to any one of the output ends o1 and o2. The first signal Sin_1 is input to the transformer 22 through a node a1 or a node a2 depending on a switching operation at the switch 21.

The transformer 22 includes a primary coil L1 having one end connected with the output end o1 of the switch 21 and the other end connected with the output end o2 of the switch 21, and a secondary coil L2 having one end connected with a node b1 and the other end connected with a node b2. The transformer 22 converts the first signal Sin_1 as a single-ended signal supplied through the switch 21 into a pair of differential signals having phases different from each other by 180°, and outputs the differential signals to the nodes b1 and b2. In other words, the signal at the node b1 and the signal at the node b2 have phases different from each other by 180°. The transformer 22 inverts the phases of the pair of differential signals in accordance with a switching operation at the switch 21. In other words, the signal at the node b1 when the switch 21 is connected with the node a1 has a phase different from that of the signal at the node b1 when the switch 21 is connected with the node a2 by 180°. The same configuration applies to the signal at the node b2.

Figure 13:
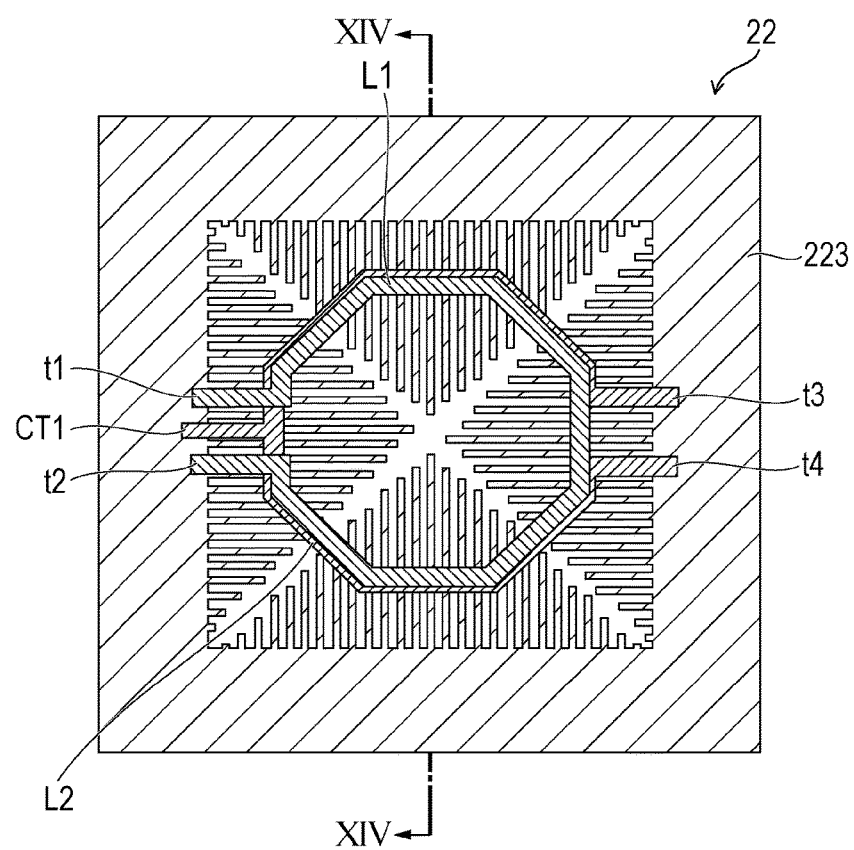
FIG. 13 is a plan view illustrating a pattern layout of a transformer according to the embodiment of the disclosed technology.
Figure 14:
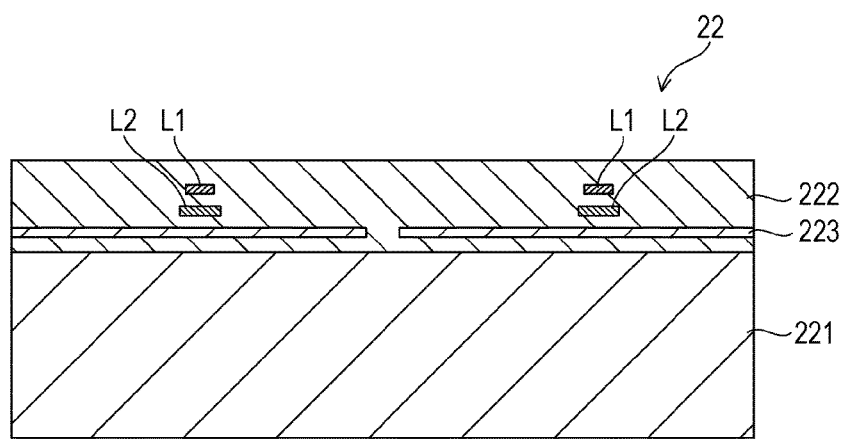
FIG. 14 is a cross-sectional view taken along line XIV-XIV in FIG. 13.

FIG. 13 is a plan view illustrating a pattern layout of the transformer 22, and FIG. 14 is a cross-sectional view taken along line XIV-XIV in FIG. 13. The primary coil L1, the secondary coil L2, and a ground metal 223 included in the transformer 22 are provided on a metal layer provided on a silicon substrate 221. The primary coil L1, the secondary coil L2, and the ground metal 223 are insulated from each other through a dielectric layer 222 provided on the silicon substrate 221. The primary coil L1 is provided on a metal layer above the secondary coil L2 and has a ring pattern. The primary coil L1 includes a terminal t1 connected with the output end o1 of the switch 21 and a terminal t2 connected with the output end o2 of the switch 21. Similarly to the primary coil L1, the secondary coil L2 has a ring pattern. The secondary coil L2 includes a terminal t3 connected with the node b1, a terminal t4 connected with the node b2, and a center tap CT1 to which a control voltage VG is supplied (refer to FIG. 6). The ring patterns of the primary coil L1 and the secondary coil L2 overlap with each other.

The ground metal 223, which is fixed to a ground potential, is provided on a metal layer below the secondary coil L2. The ground metal 223 is provided with such patterning that metal is partially removed in regions directly below the primary coil L1 and the secondary coil L2. If the regions directly below the primary coil L1 and the secondary coil L2 are filled with metal fixed to the ground potential, a parasitic capacitor having one end fixed to the ground potential is added to the primary coil L1 and the secondary coil L2, which causes characteristic degradation. If all metal in the region directly below the primary coil L1 and the secondary coil L2 is removed, the influence of the silicon substrate 221 acting as a resistance component becomes largely, which leads to a large loss. As illustrated in FIG. 14, since the ground metal 223 is provided with such patterning that metal is partially removed in the regions directly below the primary coil L1 and the secondary coil L2, the influence of the parasitic capacitor and the silicon substrate 221 is reduced, thereby obtaining a favorable characteristic. With the pattern layout of the transformer 22 illustrated in FIG. 13, a favorable characteristic may be obtained in processing of a signal having a frequency in a milli-wave band, in particular.

The variable amplifier 20 includes a pair of differential input terminals and a pair of differential output terminals. The pair of differential input terminals are connected with one end (the node b1) and the other end (the node b2) of the secondary coil L2 of the transformer 22, respectively. The pair of differential output terminals are connected with one end (a node d1) and the other end (a node d2) of a primary coil L3 of the transformer 25, respectively. The variable amplifier 20 amplifies each of a pair of differential signals input to the differential input terminals in accordance with an externally supplied control voltage, and outputs the resulting signals through the differential output terminals.

The transformer 25 includes the primary coil L3 having one end connected with the one (node d1) of the differential output terminals and the other end connected with the other (node d2) of the differential output terminals, and a secondary coil L4 having one end connected with an output end of the 0-π AMP 11 and the other end connected with the ground potential. The transformer 25 converts a pair of differential signals supplied through the nodes d1 and d2 into a single-ended signal, and outputs the resulting signal as the output signal Sout_1 from the 0-π AMP 11.

The 0-π AMP 11 changes the amplitude of the output signal Sout_1 through an amplification effect at the variable amplifier 20. The 0-π AMP 11 also changes the phase of the output signal Sout_1 by 180° in response to a switching operation at the switch 21. Specifically, when the switch 21 selects the node a1 so that the first signal Sin_1 is supplied to the transformer 22 through the node a1, the output signal Sout_1 has a phase same as that of the first signal Sin_1. When the switch 21 selects the node a2 so that the first signal Sin_1 is supplied to the transformer 22 through the node a2, the output signal Sout_1 has a phase shifted relative to that of the first signal Sin_1 by 180°.

Figure 4:
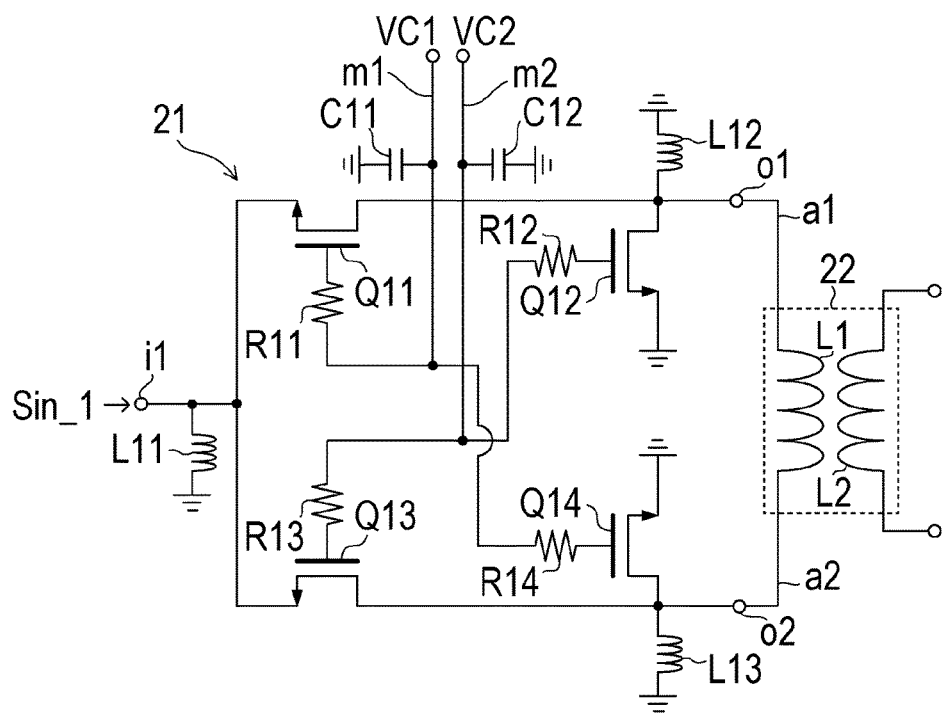
FIG. 4 is a detailed diagram illustrating the configuration of a switch according to the embodiment of the disclosed technology.

FIG. 4 is a detailed diagram illustrating the configuration of the switch 21. The switch 21 includes n-channel transistors Q11 to Q14, resistors R11 to R14, inductors L11 to L13, and capacitors C11 and C12.

The transistor Q11 has a source connected with the input end i1, a drain connected with the output end o1, and a gate connected with one end of the resistor R11. The transistor Q12 has a drain connected with the output end o1, a source connected with a ground line, a gate connected with one end of the resistor R12. The transistor Q13 has a source connected with the input end i1, a drain connected with the output end o2, and a gate connected with one end of the resistor R13. The transistor Q14 has a drain connected with the output end o2, a source connected with a ground line, and a gate connected with one end of a resistor R14. The other ends of the resistors R11 and R14 are each connected with a wiring m1, and the other ends of the resistors R12 and R13 are each connected with a wiring m2.

The capacitor C11 has one end connected with the wiring m1 and the other end connected with a ground line. The capacitor C12 has one end connected with the wiring m2 and the other end connected with a ground line. The inductor L11 has one end connected with the input end i1 and the other end connected with a ground line. The inductor L12 has one end connected with the output end o1 and the other end connected with a ground line. The inductor L13 has one end connected with the output end o2 and the other end connected with a ground line. The inductors L11, L12, and L13 are used to achieve impedance matching of capacitance components of transistors Q11 to Q14. The capacitors C11 and C12 are provided to remove any noise components in control voltages VC1 and VC2.

The control voltage VC1 is supplied to the wiring m1. The transistors Q11 and Q14 are simultaneously turned on and off in response to the control voltage VC1. The control voltage VC2 is supplied to the wiring m2. The transistors Q12 and Q13 are simultaneously turned on and off in response to the control voltage VC2. The control voltages VC1 and VC2 are complementary to each other. In other words, the control voltages VC1 and VC2 are controlled so that the transistors Q12 and Q13 are turned off while the transistors Q11 and Q14 are turned on, or the transistors Q12 and Q13 are turned on while the transistors Q11 and Q14 are turned off.

Figure 5A:
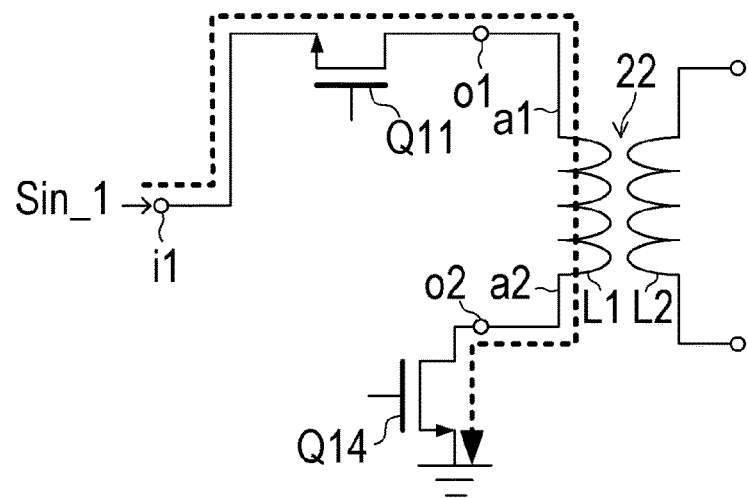
FIG. 5A is a diagram illustrating the path of a signal input to an input end of the switch according to the embodiment of the disclosed technology.

FIG. 5A is a diagram illustrating the path of the first signal Sin_1 input to the input end i1 of the switch 21 when the transistors Q11 and Q14 are turned on and the transistors Q12 and Q13 are turned off in the switch 21. When the transistors Q11 and Q14 are turned on, the first signal Sin_1 is supplied to the primary coil L1 of the transformer 22 through the node a1, and an end part of the primary coil L1, which is connected with the node a2, is short-circuited with a ground line.

Figure 5B:
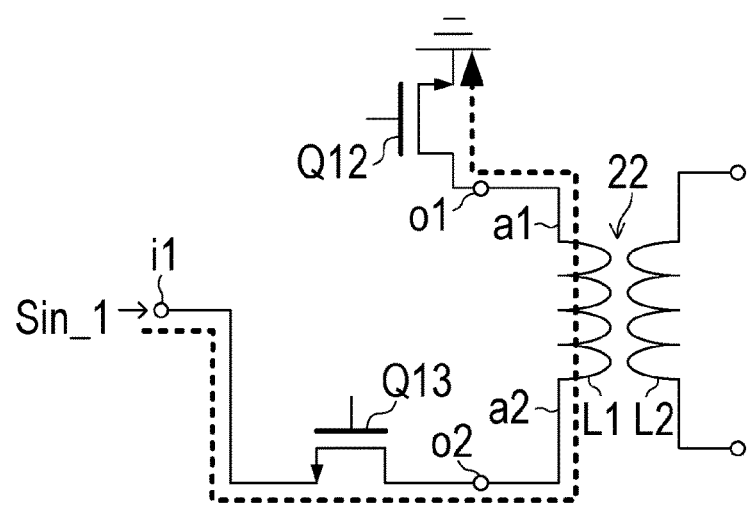
FIG. 5B is a diagram illustrating the path of a signal input to the input end of the switch according to the embodiment of the disclosed technology.

FIG. 5B is a diagram illustrating the path of the first signal Sin_1 input to the input end i1 of the switch 21 when the transistors Q12 and Q13 are turned on and the transistors Q11 and Q14 are turned off in the switch 21. When the transistors Q12 and Q13 are turned on, the first signal Sin_1 is supplied to the primary coil L1 of the transformer 22 through the node a2, and an end part of the primary coil L1, which is connected with the node a1, is short-circuited with a ground line.

Figure 6:
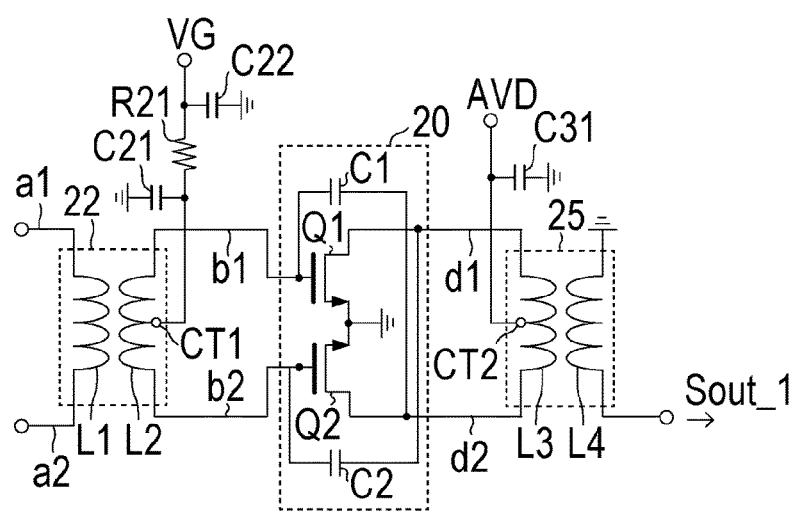
FIG. 6 is a detailed diagram illustrating the configuration of a variable amplifier according to the embodiment of the disclosed technology.

FIG. 6 is a detailed diagram illustrating the configuration of the variable amplifier 20. The variable amplifier 20 includes n-channel transistors Q1 and Q2 and capacitors C1 and C2.

The transistor Q1 has a gate connected with one end (the node b1) of the secondary coil L2 of the transformer 22, a drain connected with one end (the node d1) of the primary coil L3 of the transformer 25, and a source connected with a ground line. The transistor Q2 has a gate connected with the other end (the node b2) of the secondary coil L2 of the transformer 22, a drain connected with the other end (the node d2) of the primary coil L3 of the transformer 25, and a source connected with a ground line. The gates of the transistors Q1 and Q2 correspond to the respective differential input terminals of the variable amplifier 20, and the drains of the transistors Q1 and Q2 correspond to the respective differential output terminals of the variable amplifier 20.

The capacitor C1 has one end connected with the gate of the transistor Q1 and the other end connected with the drain of the transistor Q2. The capacitor C2 has one end connected with the gate of the transistor Q2 and the other end connected with the drain of the transistor Q1. The capacitors C1 and C2 serve as a feedback circuit for increasing the gain of the variable amplifier 20.

The variable amplifier 20 amplifies each differential signal output from the secondary coil L2 of the transformer 22 in accordance with the externally supplied control voltage VG. The control voltage VG is supplied to the center tap CT1 of the secondary coil L2 of the transformer 22 through a resistor R2 and applied to the gates of the transistors Q1 and Q2. Capacitors C21 and C22 connected with a line for supplying the control voltage VG are provided to remove any noise component in the control voltage VG. A drive voltage AVD from the variable amplifier 20 is supplied to a center tap CT2 of the primary coil L3 of the transformer 25 and supplied to the drains of the transistors Q1 and Q2. A capacitor C31 connected with a line for supplying the drive voltage AVD is provided to remove any noise component in the drive voltage AVD. When the capacitor C21 or C31 is connected with the center tap CT1 of the secondary coil L2 of the transformer 22 and the center tap CT2 of the primary coil L3 of the transformer 25, potential may be fixed at least in a desired frequency band to achieve a stable differential operation at the variable amplifier 20.

Figure 7:
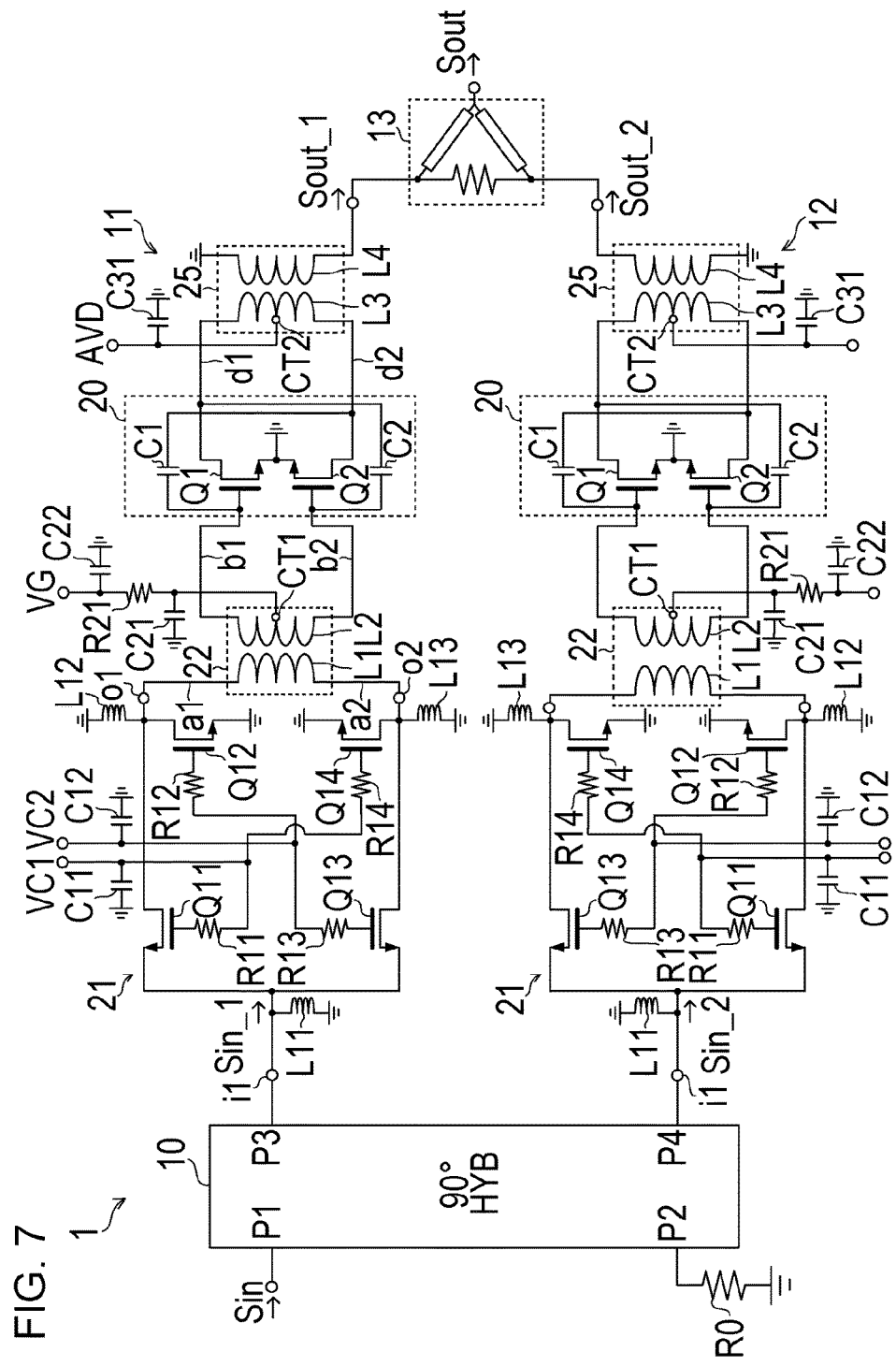
FIG. 7 is a detailed diagram illustrating the configuration of the phase shifter according to the embodiment of the disclosed technology.

FIG. 7 is a detailed diagram illustrating the configuration of the phase shifter 1. The 0-π AMP 12 has a configuration and a function identical to those of the 0-π AMP 11 described above. The output signal Sout_1 output from the 0-π AMP 11 and the output signal Sout_2 output from the 0-π AMP 12 are subjected to in-phase synthesis at the synthesizer 13. The synthesizer 13 may be, for example, a Wilkinson-type synthesizer.

The following describes operation of the phase shifter 1. When the input signal Sin is input to the port P1, the 90° hybrid circuit 10 outputs the first signal Sin_1 through the port P3, and outputs the second signal Sin_2 having a phase shifted by 90° relative to that of the first signal Sin_1 through the port P4. The first signal Sin_1 is supplied to the 0-π AMP 11, and the second signal Sin_2 is supplied to the 0-π AMP 12. The following describes operation of the 0-π AMP 11.

The transformer 22 converts the first signal Sin_1 as a single-ended signal supplied through the switch 21 into a pair of differential signals having phases different from each other by 180°, and outputs the pair of differential signals to the nodes b1 and b2. The transformer 22 inverts the phases of the pair of differential signals output to the nodes b1 and b2 in accordance with a switching operation at the switch 21.

The switch 21 performs, in response to the externally supplied control voltages VC1 and VC2, switching between a first state in which the pair of the transistors Q11 and Q14 are turned on and a second state in which the pair of the transistors Q12 and Q13 are turned on. Switching of a pair of turned-on transistors at the switch 21 causes switching of a direction in which the first signal Sin_1 is input to the primary coil L1 of the transformer 22. Accordingly, the phases of a pair of differential signals output from the secondary coil L2 of the transformer 22 are inverted.

The variable amplifier 20 amplifies the amplitudes of the differential signals supplied to the nodes b1 and b2 in accordance with the externally supplied control voltage VG. The amount of amplification at the variable amplifier 20 is controlled so that the output signal Sout of the phase shifter 1 obtains desired phase and amplitude.

The differential signals having amplitudes adjusted by the variable amplifier 20 are converted into a single-ended signal by the transformer 25 and output as the output signal Sout_1 from the 0-π AMP 11. The phase of the output signal Sout_1 is different from that of the first signal Sin_1 by 0° or 180° depending on a switching operation at the switch 21.

Similarly to the 0-π AMP 11, the 0-π AMP 12 outputs the output signal Sout_2 having a phase different from that of the second signal Sin_2 by 0° or 180° depending on a switching operation at the switch 21. In other words, the output signal Sout_2 has a phase different from that of the output signal Sout_1 by 90° or 270°.

The output signal Sout_1 from the 0-π AMP 11 and the output signal Sout_2 from the 0-π AMP 12 are subjected to vector synthesis at the synthesizer 13. The resulting synthesized signal is output as the output signal Sout of the phase shifter 1. Since the 0-π AMPs 11 and 12 have functions of switching the phases of the respective output signals Sout_1 and Sout_2 by 180° and changing the amplitudes thereof, the phase of the output signal Sout may be shifted in a range of 0° to 360° while the amplitude thereof is maintained.

Figure 8A:
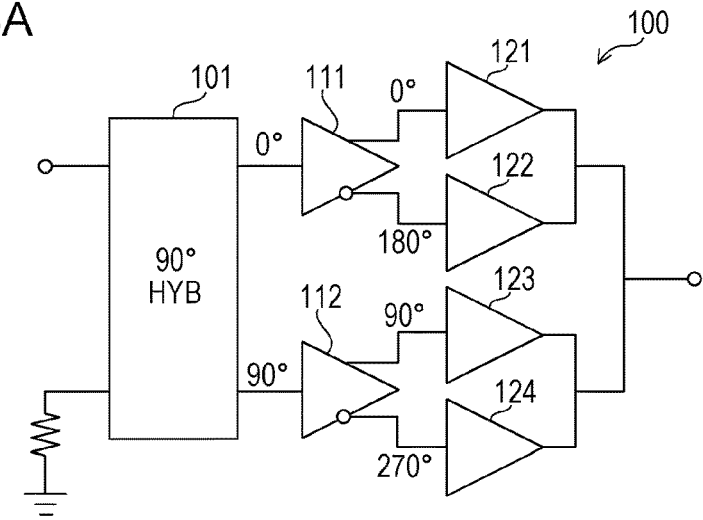
FIG. 8A is a diagram illustrating the configuration of a phase shifter according to a comparative example.
Figure 8B:
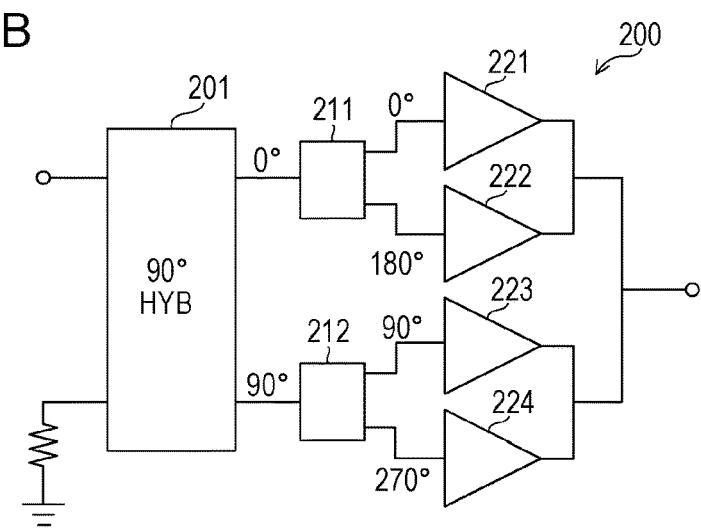
FIG. 8B is a diagram illustrating the configuration of the phase shifter according to another comparative example.

FIGS. 8A and 8B are each a diagram illustrating the configuration of a phase shifter according to a comparative example. A phase shifter 100 according to a first comparative example illustrated in FIG. 8A includes a 90° hybrid circuit 101, signal converters 111 and 112, and variable gain amplifiers 121, 122, 123, and 124. The 90° hybrid circuit 101 divides an input signal into two signals having amplitudes identical to each other and phases different from each other by 90°. The signal converters 111 and 112 each convert a single-ended signal output from the 90° hybrid circuit 101 into a pair of differential signals having phases different from each other by 180°. These signals output from the signal converter 111 have phases different from that of the input signal by 0° and 180° and are supplied to the variable gain amplifiers 121 and 122, respectively. These signals output from the signal converter 112 have phases different from the input signal by 90° and 270° and are supplied to the variable gain amplifiers 123 and 124, respectively. The variable gain amplifiers 121 to 124 each amplify the corresponding input signal in accordance with an externally supplied control voltage and output the resulting signal. In the phase shifter 100 according to the first comparative example, one of the variable gain amplifiers 121 and 122 is turned on while the other is turned off, and one of the variable gain amplifiers 123 and 124 is turned on while the other is turned off. A phase shifter 2 performs vector synthesis of output signals from two variable gain amplifiers being turned on among the variable gain amplifiers 121 to 124, and outputs the resulting signal.

Since the phase shifter 100 according to the first comparative example generates an output signal through vector synthesis of two signals having phases different from each other by 90° or 270°, the phase of the output signal may be shifted continuously in a range of 0° to 360°. However, the four variable gain amplifiers 121 to 124 are each an active circuit consuming electrical power, which leads to a large electric power consumption of the phase shifter 2. When a phased array system is formed as a combination of a plurality of the phase shifters 100 according to the first comparative example, this electric power consumption causes is a more significant problem.

A phase shifter 200 according to a second comparative example illustrated in FIG. 8B includes a 90° hybrid circuit 201, signal converters 211 and 212, and variable gain amplifiers 221, 222, 223, and 224. The phase shifter 200 according to the second comparative example is different from the phase shifter 2 according to the first comparative example described above in that the signal converters 211 and 212 are each a passive circuit that does not request drive electrical power. In the phase shifter 200 according to the second comparative example, one of the variable gain amplifiers 221 and 122 is turned on while the other is turned off, and one of the variable gain amplifiers 223 and 224 is turned on while the other is turned off. The phase shifter 200 performs vector synthesis of output signals from two variable gain amplifiers being turned on among the variable gain amplifiers 221 to 224, and outputs the resulting signal.

The phase shifter 200 according to the second comparative example may achieve reduced electric power consumption as compared to the phase shifter 100 according to the first comparative example. However, since the signal converters 211 and 212 are each a passive circuit, the impedance of the circuit potentially changes in response to switching of the variable gain amplifiers 221 to 224. This leads to a reduced accuracy of the amplitudes of output signals from two turned-on variable gain amplifiers, potentially reducing the accuracy of the phase of an output signal generated through vector synthesis of these signals.

Figure 8C:
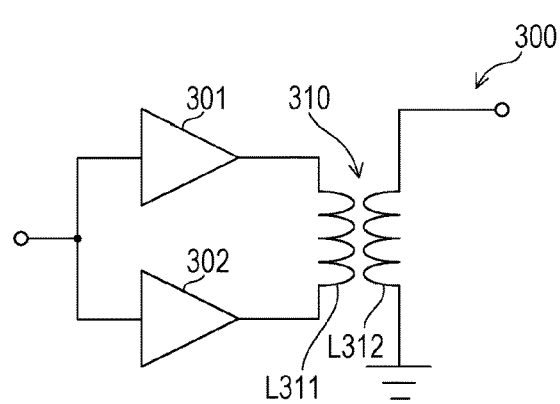
FIG. 8C is a diagram illustrating the configuration of a phase-switch-equipped variable amplification device according to another comparative example.

FIG. 8C is a diagram illustrating the configuration of a phase-switch-equipped variable amplification device 300 (hereinafter referred to as a 0-π AMP 300) according to a comparative example, which may be a component of a phase shifter. The 0-π AMP 300 according to the comparative example includes amplifiers 301 and 302 each including a transistor, and a transformer 310. A single-ended signal is input to each of the amplifiers 301 and 302. The transformer 310 includes a primary coil L311 and a secondary coil L312. Output signals from the amplifiers 301 and 302 are input as differential signals to the primary coil L311. The differential signals are converted into a single-ended signal at the transformer 310 and output from the secondary coil L312. In the 0-π AMP 300, one of the amplifiers 301 and 302 is turned on while the other is turned off. The 0-π AMP 300 according to the comparative example switches the phase of an output signal by switching amplifiers being turned on among the amplifiers 301 and 302.

In the 0-π AMP 300 according to the comparative example, one end of the primary coil L311 of the transformer 310 is connected with an amplifier being turned off, at which a loss generates. Output electrical power corresponding to the loss may be compensated by adding an amplifier at a later stage or increasing drive electrical power of the amplifiers 301 and 302, which results in increases of electric power consumption.

In the phase shifter 1 according to the present embodiment of the disclosed technology, however, the 0-π AMPs 11 and 12 each have functions of changing the amplitude of an output signal and inverting the phase thereof. Accordingly, the phase shifter 1 has a circuit configuration composed of two systems for processing the first signal Sin_1 and for processing the second signal Sin_2. Thus, the phase shifter 1 may achieve reduced electric power consumption as compared to the phase shifter 100 according to the first the comparative example, which controls phases and amplitudes, by generating four signals and supplying these four signals to the four variable gain amplifiers. In addition, voltage between the source and the drain of each of the transistors Q1 to Q6 included in the switch 21 is 0 V, and thus no electrical power is consumed at these transistors.

Since the phase shifter 1 according to the present embodiment has a symmetrical circuit configuration, the impedance of the circuit does not change when the phases of the output signals Sout_1 and Sout_2 from the 0-π AMPs 11 and 12 are switched by 180°. This provides an increased accuracy of the amplitude and phase of the output signal Sout of the phase shifter 1.

In the phase shifter 1 according to the present embodiment, a direction in which a signal is input to the primary coil L1 of the transformer 22 is switched when a pair of transistors being turned on are switched at the switch 21 (refer to FIGS. 5A and 5B). Accordingly, the phases of a pair of differential signals output from the secondary coil L2 of the transformer 22 are inverted. An end part of the primary coil L1 of the transformer 22, which is opposite to an end part to which a signal is input, is short-circuited with a ground line. In other words, in the phase shifter 1 according to the present embodiment, no circuit that generates a loss is connected with one end of the primary coil L1 of the transformer 22, which leads to a reduced loss as compared to the 0-π AMP 300 according to the comparative example.

Figure 9A:
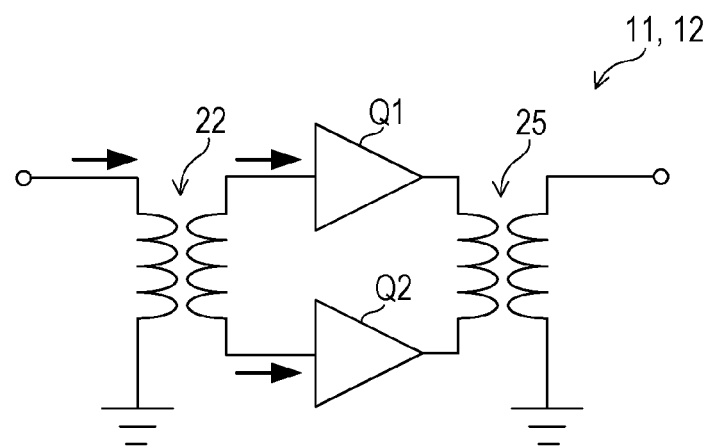
FIG. 9A is a diagram illustrating the flow of a signal in the phase-switch-equipped variable amplification device according to the embodiment of the disclosed technology.
Figure 9B:
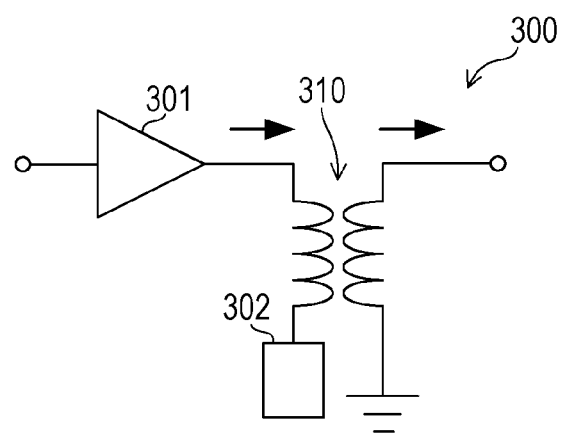
FIG. 9B is a diagram illustrating the flow of a signal in the phase-switch-equipped variable amplification device according to the comparative example.

FIG. 9A is a diagram illustrating the flow of a signal through the 0-π AMPs 11 and 12 according to the present embodiment. FIG. 9B is a diagram illustrating the flow of a signal through the 0-π AMP 300 according to the comparative example. FIG. 9B exemplarily illustrates a case in which the amplifier 301 is turned on while the amplifier 302 is turned off.

As illustrated in FIG. 9A, in the 0-π AMPs 11 and 12 according to the present embodiment, the transformer 22 is used as a three-port input/output circuit. In the 0-π AMPs 11 and 12, the phase of an output signal is switched by switching a direction in which a signal is input to the transformer 22 provided on input sides of the transistors Q1 and Q2. In the 0-π AMPs 11 and 12, the variable amplifier 20 including the transistors Q1 and Q2 has a differential configuration, which has high resistance against common mode noise, and is configured to perform differential synthesis of outputs from the transistors Q1 and Q2.

In the 0-π AMP 300 according to the comparative example, however, the transformer 310 is used as a two-port input/output circuit. In the 0-π AMP 300 according to the comparative example, the phase of an output signal is switched by switching an amplifier being turned on among the amplifiers 301 and 302. In the 0-π AMPs 300 and 12 according to the comparative example, outputs from the amplifiers are single-ended signals. In the 0-π AMPs 300 and 12 according to the comparative example, an amplifier being turned off acts as a load on an amplifier being turned on, which leads to a large loss.

In the 0-π AMPs 11 and 12 according to the present embodiment, one end of the primary coil L1 of the transformer 22 is short-circuited with a ground line, which leads to a reduced loss as compared to the 0-π AMP 300 according to the comparative example.

Second Embodiment

Figure 10:
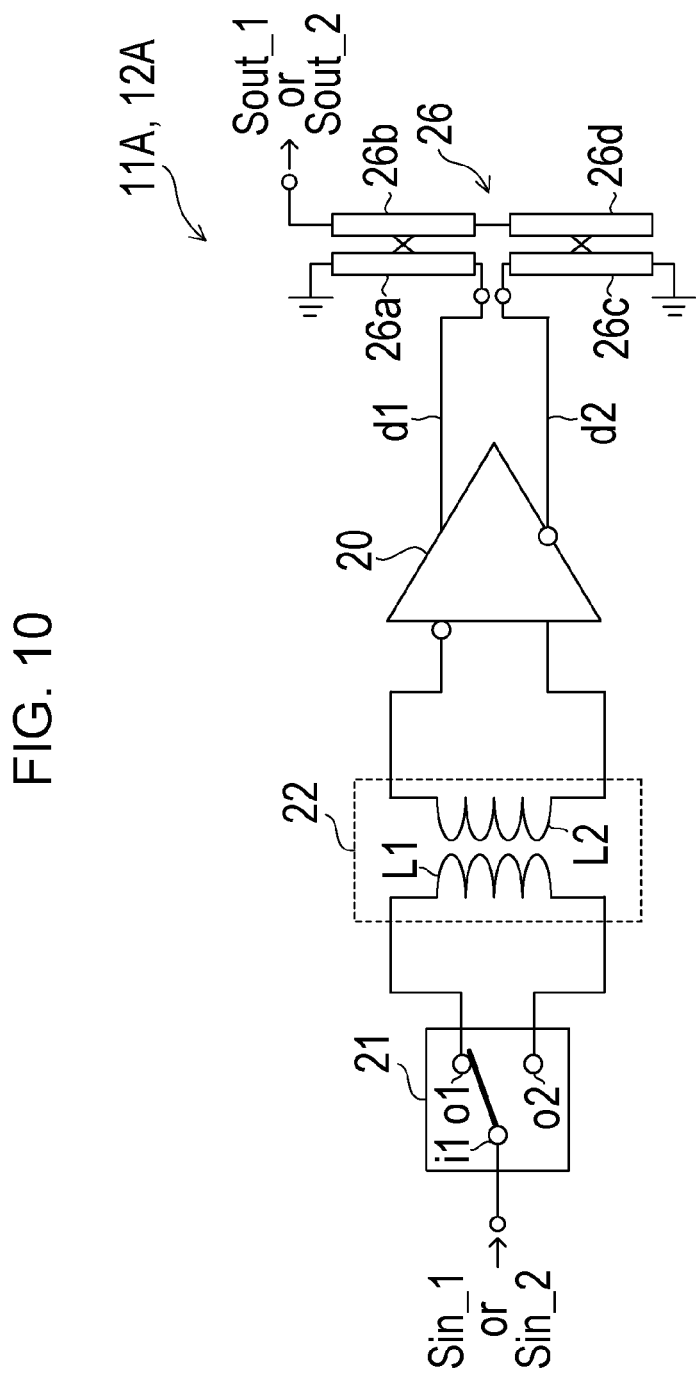
FIG. 10 is a circuit block diagram illustrating the configuration of a phase-switch-equipped variable amplification device according to another embodiment of the disclosed technology.

FIG. 10 is a diagram illustrating the configured of 0-π AMPs 11A and 12A according to a second embodiment of the disclosed technology. The above-described 0-π AMPs 11 and 12 according to the first embodiment each include the transformer 25 to convert differential signals into a single-ended signal. However, the 0-π AMPs 11A and 12A according to the second embodiment each include a merchand balun 26 to convert differential signals into a single-ended signal. The merchand balun 26 includes a coupled line composed of lines 26a and 26b and a coupled line composed of lines 26c and 26d. The lines 26a, 26b, 26c, and 26d each have a line length corresponding to ¼ of the wavelength of a signal. The line 26a has one end connected with a ground line and the other end connected with one (the node d1) of the differential output terminals of the variable amplifier 20. The line 26c has one end connected with a ground line and the other end connected with the other (the node d2) of the differential output terminals of the variable amplifier 20. The line 26b has one end connected with an output end of the 0-π AMP 11A or 12A and the other end connected with one end of the line 26d. The other end of the line 26d is open. With this configuration, the 0-π AMPs 11A and 12A, which each include the merchand balun 26 to convert differential signals into a single-ended signal, may achieve functions same as those of the 0-π AMPs 11 and 12 according to the first embodiment.

Third Embodiment

Figure 11:
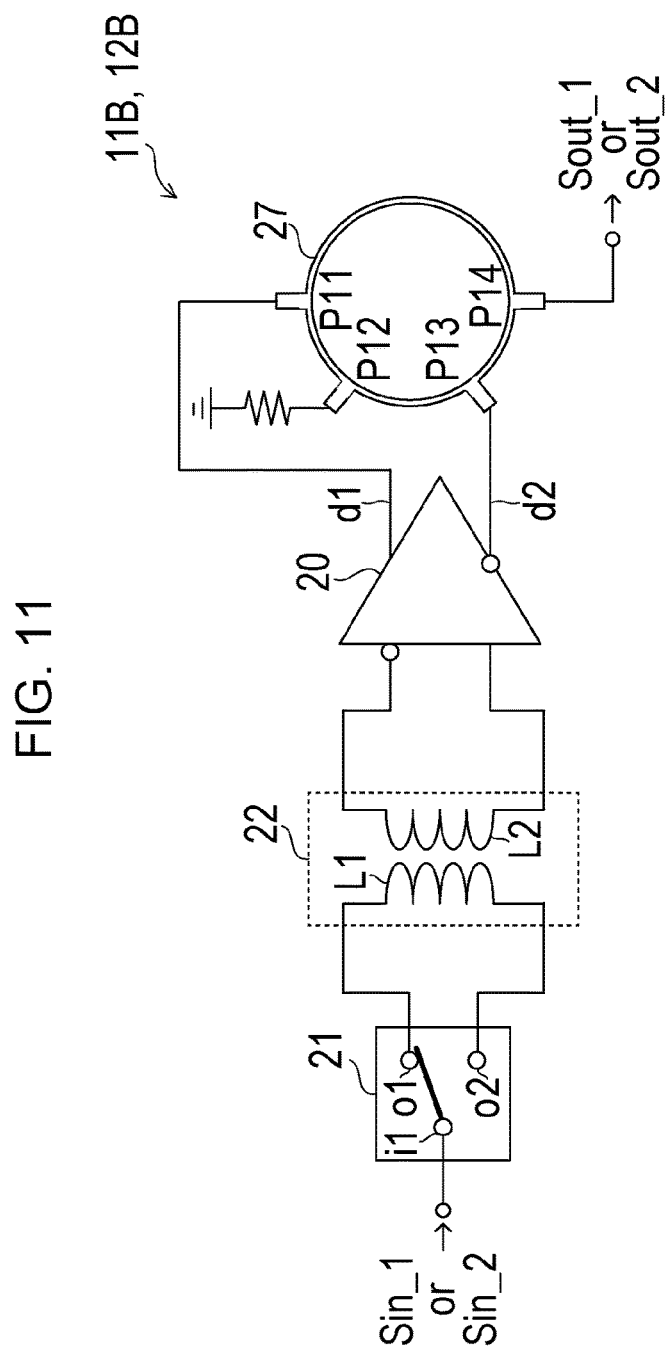
FIG. 11 is a circuit block diagram illustrating the configuration of a phase-switch-equipped variable amplification device according to another embodiment of the disclosed technology.

FIG. 11 is a diagram illustrating the configuration of 0-π AMPs 11B and 12B according to a third embodiment of the disclosed technology. The above-described 0-π AMPs 11 and 12 according to the first embodiment each include the transformer 25 to convert differential signals into a single-ended signal. However, the 0-π AMPs 11B and 12B according to the third embodiment each include a rat race hybrid circuit 27 to convert differential signals into a single-ended signal. The rat race hybrid circuit 27 is a circuit in which three ¼ wavelength transmission lines and one ¾ wavelength transmission line are connected with each other in a ring shape, and is capable of performing in-phase distribution and reversed-phase distribution of an input signal through selection of an input terminal. The rat race hybrid circuit 27 includes a port P11 connected with one (the node d1) of the differential output terminals of the variable amplifier 20 and a port P12 connected with a ground line through a resistor. A port P13 is connected with the other (the node d2) of the differential output terminals of the variable amplifier 20, and a port P14 is connected with an output end of the 0-π AMP 11B or 12B. With this configuration, the 0-π AMPs 11B and 12B, which each include the rat race hybrid circuit 27 to convert differential signals into a single-ended signal, may achieve functions same as those of the 0-π AMPs 11 and 12 according to the first embodiment.

Fourth Embodiment

Figure 12:
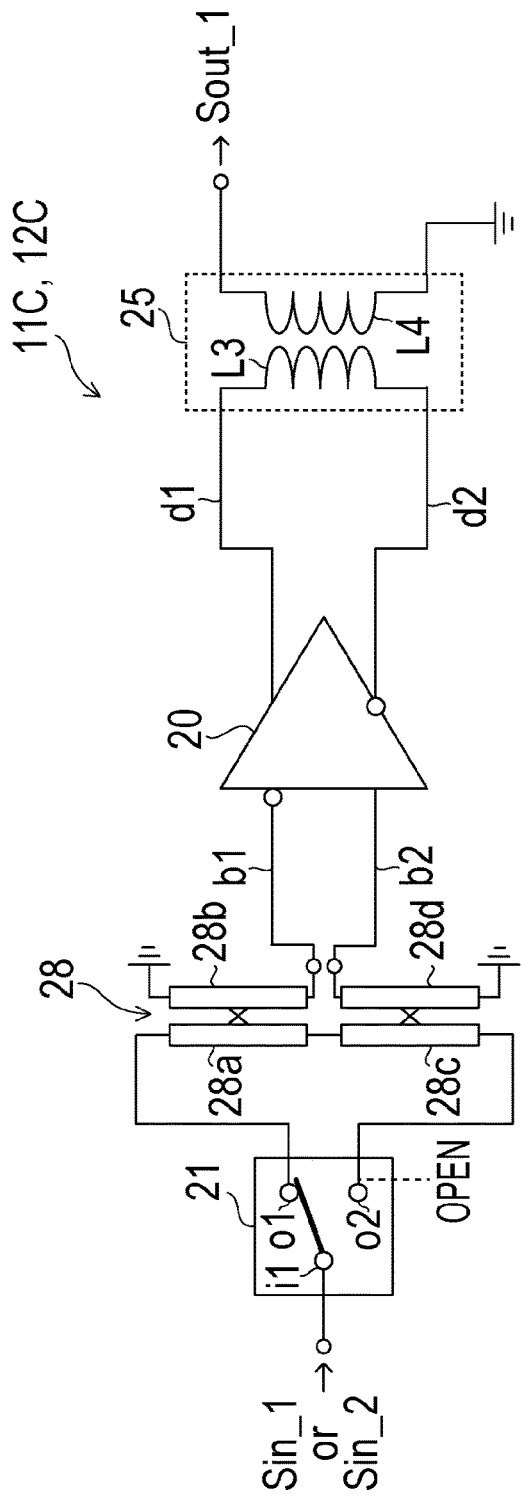
FIG. 12 is a circuit block diagram illustrating the configuration of a phase-switch-equipped variable amplification device according to another embodiment of the disclosed technology.

FIG. 12 is a diagram illustrating the configuration of 0-π AMPs 11C and 12C according to a fourth embodiment of the disclosed technology. The above-described 0-π AMPs 11 and 12 according to the first embodiment each include the transformer 22 to convert a single-ended signal into differential signals. However, the 0-π AMPs 11B and 12B according to the fourth embodiment each include a merchand balun 28 to convert a single-ended signal into differential signals. The merchand balun 28 includes a coupled line composed of lines 28a and 28b and a coupled line composed of lines 28c and 28d. The lines 28a, 28b, 28c, 28d each have a line length corresponding to ¼ of the wavelength of a signal. The line 28a has one end connected with the output end o1 of the switch 21 and the other end connected with one end of the line 28c. The other end of the line 28c is connected with the output end o2 of the switch 21. The line 28b has one end connected with a ground line and the other end connected with one (the node b1) of the differential input terminals of the variable amplifier 20. The line 28d has one end connected with a ground line and the other end connected with the other (the node b2) of the differential input terminals of the variable amplifier 20. When the merchand balun 28 is provided to convert a single-ended signal into differential signals, the switch 21 is configured as described below. Specifically, in the switch 21, the output end o2 is open when the output end o1 is selected, or the output end o1 is open when the output end o2 is selected. With this configuration, the 0-π AMPs 11C and 12C, which each include the merchand balun 28 to convert a single-ended signal into differential signals, may achieve functions same as those of the 0-π AMPs 11 and 12 according to the first embodiment.

The above-described configurations of the 0-π AMPs 11, 11A to 11D, 12, and 12A to 12D according to the first to fourth embodiments may be combined with each other as appropriate.

The 0-π AMPs 11, 11A, 11B, 11C, 12, 12A, 12B, and 12C are each an exemplary phase-switch-equipped variable amplification device in the disclosed technology. The switch 21 is an exemplary switch in the disclosed technology. The transformer 22 and the merchand balun 28 are each an exemplary first converter in the disclosed technology. The transformer 25, the merchand balun 26, and the rat race hybrid circuit 27 are each an exemplary second converter in the disclosed technology. The variable amplifier 20 is an exemplary variable amplifier in the disclosed technology. The phase shifter 1 is an exemplary phase shifter in the disclosed technology. The 90° hybrid circuit 10, 101, 201 is an exemplary signal distributor in the disclosed technology. The synthesizer 13 is an exemplary synthesizer in the disclosed technology.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A phase-switch-equipped variable amplification device comprising:
   a switch including one input port and two output ports and configured to output a single-ended signal input to the one input port into one of the two output ports;
   a first converter coupled to the two output ports of the switch and configured to convert the single-ended signal output from the switch into a pair of differential signals having phases different from each other by 180-degree and invert phases of the pair of differential signals in response to a switching operation at the switch;
   a variable amplifier configured to amplify the pair of differential signals in accordance with a control voltage; and
   a second converter configured to convert the pair of differential signals amplified by the variable amplifier into a single-ended signal.

2. The phase-switch-equipped variable amplification device according to claim 1, wherein the first converter includes a first transformer including a primary coil having ports coupled to the two output ports of the switch, and a secondary coil having ports coupled to input ports of the variable amplifier.

3. The phase-switch-equipped variable amplification device according to claim 2, wherein a direction in which the single-ended signal switched by the switch and supplied to the first transformer is input to the primary coil is switched in response to a switching operation at the switch.

4. The phase-switch-equipped variable amplification device according to claim 3, wherein the switch short-circuits one of the two output ports, which is not coupled to the one input port, to a predetermined potential.

5. The phase-switch-equipped variable amplification device according to claim 4, wherein the switch includes a third transistor arranged between the one input port and one of the two output ports, a fourth transistor arranged between the one of the two output ports and a ground line, a fifth transistor arranged between the one input port and the other of the two output ports, and a sixth transistor provided between other of the two output ports and a ground line.

6. The phase-switch-equipped variable amplification device according to claim 2, wherein the control voltage is supplied to the variable amplifier through a center tap of the secondary coil of the first transformer.

7. The phase-switch-equipped variable amplification device according to claim 2, wherein the second converter includes a second transformer including a primary coil having ports coupled to output ports of the variable amplifier, and a secondary coil configured to output the single-ended signal converted from the pair of differential signals.

8. The phase-switch-equipped variable amplification device according to claim 7, wherein a drive voltage of the variable amplifier is supplied to the variable amplifier through a center tap of the primary coil of the second transformer.

9. The phase-switch-equipped variable amplification device according to claim 8, wherein the variable amplifier includes a first transistor having a gate coupled to one of the ports of the secondary coil of the first transformer and a drain coupled to one of the ports of the primary coil of the second transformer, and
a second transistor having a gate coupled to other of the ports of the secondary coil of the first transformer and a drain coupled to other of the ports of the primary coil of the second transformer.

10. The phase-switch-equipped variable amplification device according to claim 1,
   wherein the first converter includes a merchand balun including a first coupled line and a second coupled line, the first coupled line including a first line and a second line, and the second coupled line including a third line and a fourth line,
   wherein the first line has one port coupled to one of the two output ports of the switch and other port coupled to one port of the third line, the third line has other port coupled to other of the two output ports of the switch, and
   wherein the second line has one port coupled to a ground line and other port coupled to a first input port of the variable amplifier, and the fourth line has one port coupled to a ground line and other port coupled to a second input port of the variable amplifier.

11. The phase-switch-equipped variable amplification device according to claim 10, wherein the switch opens one of the two output ports, which is not coupled to the one input port.

12. A phase shifter comprising:
   a signal distributor configured to output each of two single-ended signals having phases different from each other by 90-degree through respectively of output ports;
   two phase-switch-equipped variable amplification devices coupled to the output ports of the signal distributor, each of the two phase-switch-equipped variable amplification devices including
   a switch including one input port and two output ports and configured to output a single-ended signal input to the one input port that is one of the two single-ended signals output through one of the output ports, into one of the two output ports,
   a first converter coupled to the two output ports of the switch and configured to convert the single-ended signal output from the switch into a pair of differential signals having phases different from each other by 180-degree and invert phases of the pair of differential signals in response to a switching operation at the switch,
   a variable amplifier configured to amplify the pair of differential signals in accordance with a control voltage, and
   a second converter configured to convert the pair of differential signals amplified by the variable amplifier into a single-ended signal; and
   a synthesizer configured to synthesize two of the single-ended signal converted respectively by two of the second converter.

13. The phase shifter according to claim 12, wherein the first converter includes a first transformer including a primary coil having ports coupled to the two output ports of the switch, and a secondary coil having ports coupled to input ports of the variable amplifier.

14. The phase shifter according to claim 13, wherein a direction in which the single-ended signal switched by the switch and supplied to the first transformer is input to the primary coil is switched in response to a switching operation at the switch.

15. The phase shifter according to claim 13, wherein the control voltage is supplied to the variable amplifier through a center tap of the secondary coil of the first transformer.

16. The phase shifter according to claim 13, wherein the second converter includes a second transformer including a primary coil having ports coupled to output ports of the variable amplifier, and a secondary coil configured to output the single-ended signal converted from the pair of differential signals.

17. The phase shifter according to claim 16, wherein a drive voltage of the variable amplifier is supplied to the variable amplifier through a center tap of the primary coil of the second transformer.

18. The phase shifter according to claim 17, wherein the variable amplifier includes
a first transistor having a gate coupled to one of the ports of the secondary coil of the first transformer and a drain coupled to one of the ports of the primary coil of the second transformer, and
a second transistor having a gate coupled to other of the ports of the secondary coil of the first transformer and a drain coupled to other of the ports of the primary coil of the second transformer.

19. The phase shifter according to claim 12,
wherein the first converter includes a merchand balun including a first coupled line and a second coupled line, the first coupled line including a first line and a second line, and the second coupled line including a third line and a fourth line,
wherein the first line has one port coupled to one of the two output ports of the switch and other port coupled to one port of the third line, the third line has other port coupled to other of the two output ports of the switch, and
wherein the second line has one port coupled to a ground line and other port coupled to a first input port of the variable amplifier, and the fourth line has one port coupled to a ground line and other port coupled to a second input port of the variable amplifier.

20. The phase shifter according to claim 12, wherein the switch includes a third transistor arranged between the one input port and one of the two output ports, a fourth transistor arranged between the one of the two output ports and a ground line, a fifth transistor arranged between the one input port and the other of the two output ports, and a sixth transistor provided between other of the two output ports and a ground line.

* * * * *